US011646747B1

(12) United States Patent
Lok

(10) Patent No.: US 11,646,747 B1
(45) Date of Patent: May 9, 2023

(54) MULTI-CHANNEL INTERLEAVED ANALOG-TO-DIGITAL CONVERTER (ADC) USING OVERLAPPING MULTI-PHASE CLOCKS WITH SAR-SEARCHED INPUT-CLOCK DELAY ADJUSTMENTS AND BACKGROUND OFFSET AND GAIN CORRECTION

(71) Applicant: Caelus Technologies Limited, Hong Kong (HK)

(72) Inventor: Chi Fung Lok, Hong Kong (HK)

(73) Assignee: Caelus Technologies Limited, Hong Kong (HK)

( * ) Notice: Subject to any disclaimer, the term of this patent is extended or adjusted under 35 U.S.C. 154(b) by 0 days.

(21) Appl. No.: 17/580,805

(22) Filed: Jan. 21, 2022

Related U.S. Application Data

(63) Continuation-in-part of application No. 17/537,460, filed on Nov. 29, 2021, and a continuation-in-part of application No. 17/455,471, filed on Nov. 18, 2021.

(51) Int. Cl.
  *H03M 1/10* (2006.01)
  *H03M 1/12* (2006.01)
  (Continued)

(52) U.S. Cl.
  CPC ....... *H03M 1/1057* (2013.01); *H03M 1/1215* (2013.01); *H03M 1/0624* (2013.01);
  (Continued)

(58) Field of Classification Search
  CPC .... H03M 1/1014; H03M 1/1033; H03M 1/12; H03M 1/38; H03M 1/0624; H03M 1/1023
  See application file for complete search history.

(56) References Cited

U.S. PATENT DOCUMENTS

| 7,312,734 B2 | 12/2007 | McNeill et al. |
| 7,404,162 B2 | 7/2008 | Matsuo et al. |

(Continued)

OTHER PUBLICATIONS

Ru Yi et al., "Digital Compensation for Timing Mismatch in Interleaved ADCs", 2013 Asian Test Sym., Proc. IEEE, Nov. 18, 2013, pp. 134-139.

(Continued)

*Primary Examiner* — Joseph J Lauture
(74) *Attorney, Agent, or Firm* — G Patent LLC; Stuart T Auvinen

(57) ABSTRACT

An N-channel interleaved Analog-to-Digital Converter (ADC) has a variable delay added to each ADC's input sampling clock. The variable delays are each programmed by a Successive-Approximation-Register (SAR) during calibration to minimize timing skews between channels. Each channel receives a sampling clock with a different phase delay. The sampling clocks are overlapping multi-phase clocks rather than non-overlapping. Overlapping the multi-phase clocks allows the sampling pulse width to be enlarged, providing more time for the sampling switch to remain open and allow analog voltages to equalize through the sampling switch. Higher sampling-clock frequencies are possible than when non-overlapping clocks are used. The sampling clock is boosted in voltage by a bootstrap driver to increase the gate voltage on the sampling switch, reducing the ON resistance. Sampling clock and component timing skews are reduced to one LSB among all N channels.

20 Claims, 15 Drawing Sheets

(51) Int. Cl.
 *H03M 1/38* (2006.01)
 *H03M 1/06* (2006.01)

(52) U.S. Cl.
 CPC ........ *H03M 1/1014* (2013.01); *H03M 1/1023* (2013.01); *H03M 1/12* (2013.01); *H03M 1/38* (2013.01)

(56) References Cited

U.S. PATENT DOCUMENTS

| | | | |
|---|---|---|---|
| 8,159,377 | B2 | 4/2012 | Goldman et al. |
| 8,519,875 | B2 | 8/2013 | Straayer |
| 8,872,680 | B2 | 10/2014 | Ali |
| 8,890,728 | B2 | 11/2014 | Le Dortz et al. |
| 9,444,479 | B2 | 9/2016 | Dedic et al. |
| 9,608,652 | B2 | 3/2017 | Lee et al. |
| 10,312,927 | B1 | 6/2019 | Mirhaj et al. |
| 10,608,654 | B2 | 3/2020 | Ali |
| 11,152,931 | B2 | 10/2021 | Singer |
| 2022/0057522 | A1* | 2/2022 | Mostafanezhad ..... G01S 17/931 |

OTHER PUBLICATIONS

Manar El-Chammas et al., "A 12-GS/s 81-mW 5-bit Time-Interleaved Flash ADC with Background Timing Skew Calibration", IEEE JSSC, vol. 46, No. 4, Mar. 3, 2011, pp. 838-847.
Louwsma Simon et al., "Time-Interleaved Analog-to-Digital Converters", Sep. 18, 2010, Springer Netherlands, ISBN: 978-94-007-9951-6, pp. 12-17, 78-90.
Naoki Kurosawa et al, "Explicit Analysis of Channel Mismatch Effects in Time-Interleaved ADC Systems", IEEE TCAS I, vol. 48, No. 3, Mar. 2001.
Behzad Razavi, "Design Considerations for Interleaved ADCs", IEEE JSSC, vol. 48, No. 8, Aug. 2013.
Hegong Wei et Al., "An 8 Bit 4GS/s 120mW CMOS ADC", IEEE JSSC, vol. 49, No. 8, Aug. 2014.
Nicolas Le Dortz et. al., "A 1.62GS/s Time-Interleaved SAR ADC with Digital Background Mismatch Calibration Achieving Interleaving Spurs Below 70 dBFS", ISSCC, p. 386-388, Feb. 2014.
Chi-Hang Chan et al., "A 39mW 7b 8GS/s 8-way TI ADC with Cross-linearized Input and Bootstrapped Sampling Buffer Front-end", ESSCIRC, p. 254-257, 2018.

* cited by examiner

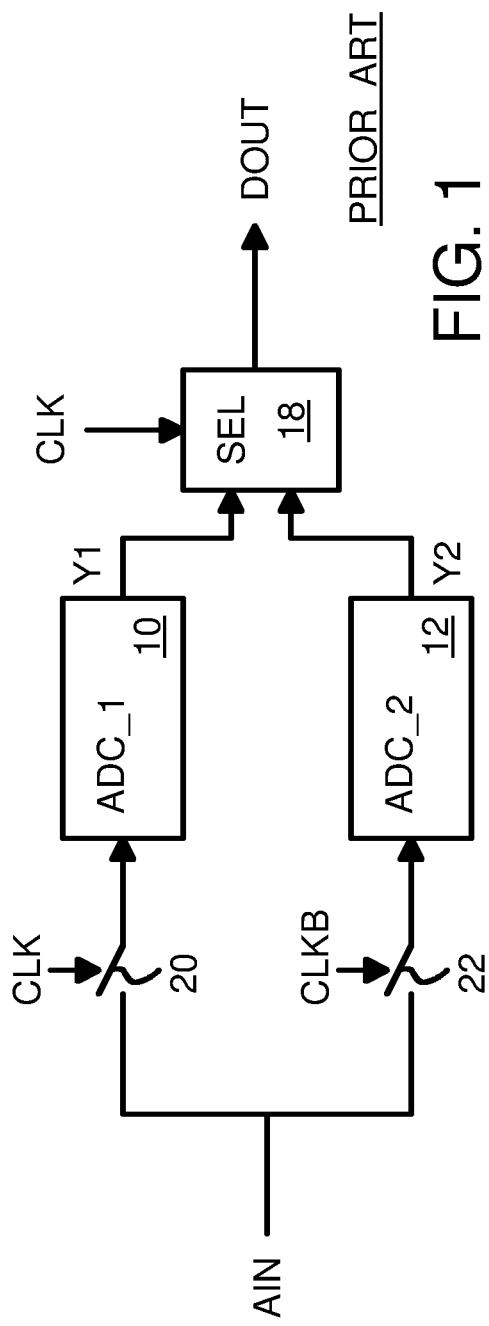
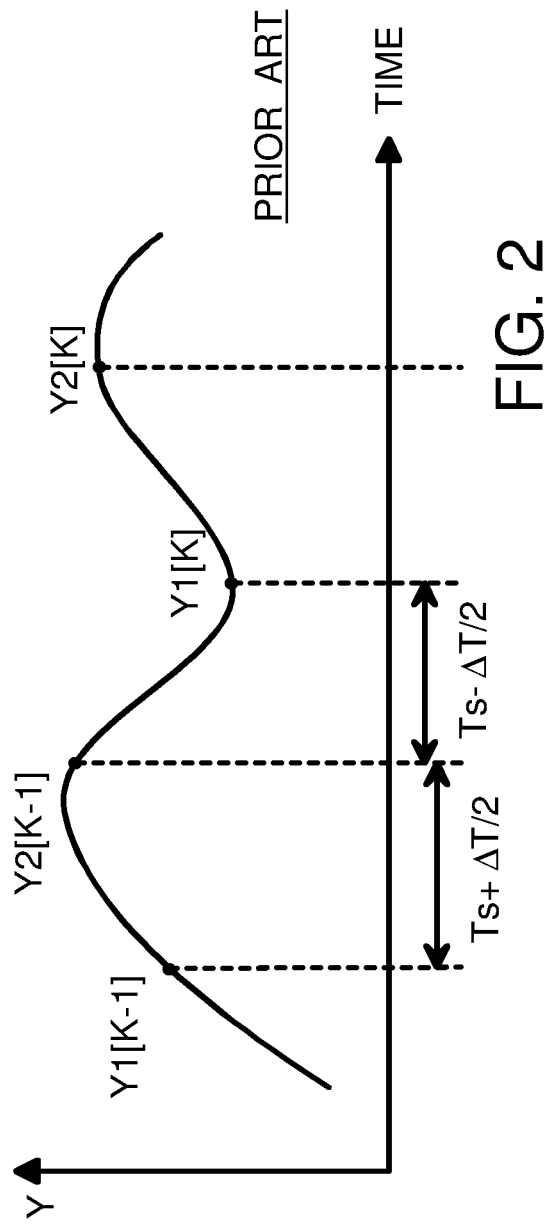

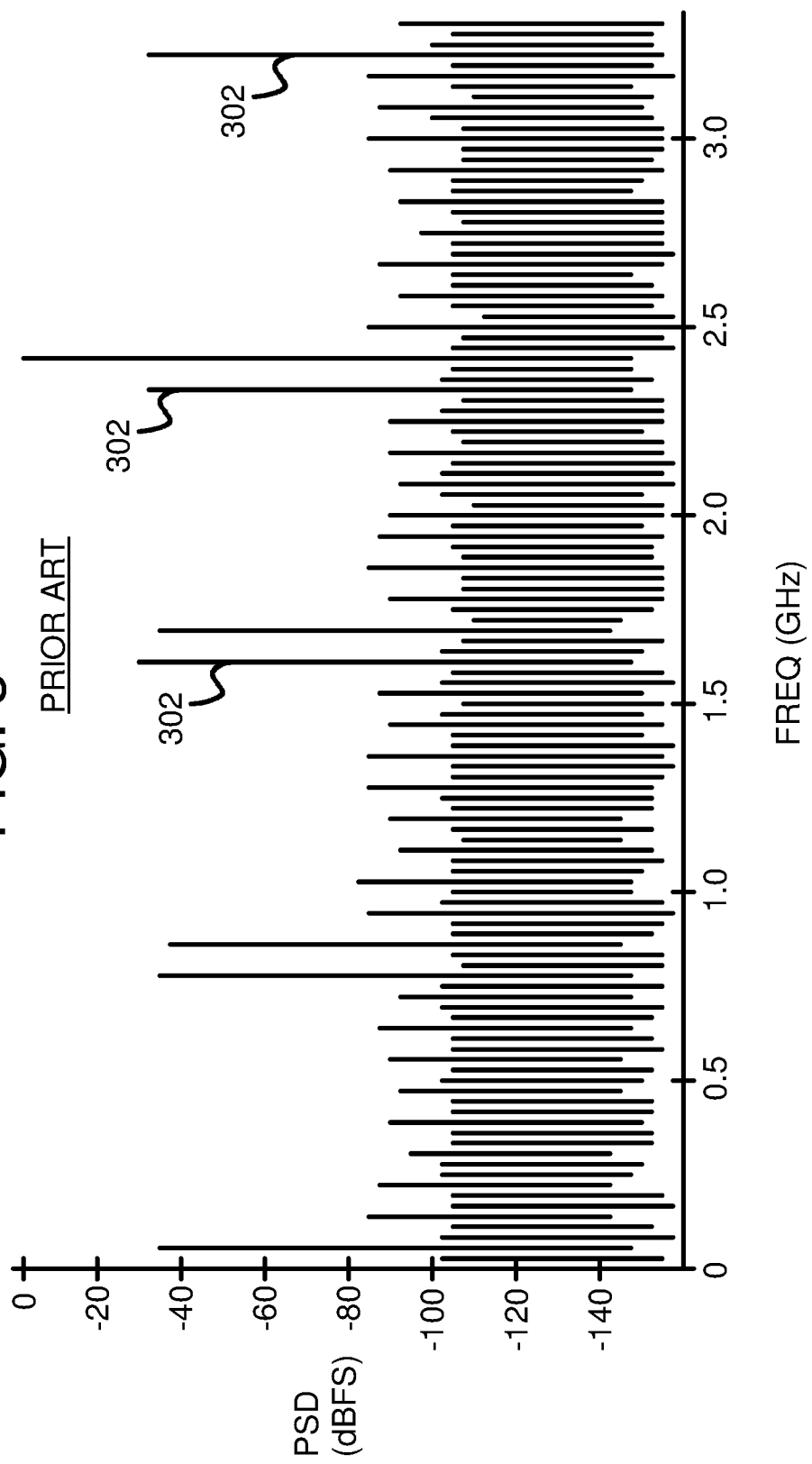

MULTI-CHANNEL INTERLEAVED ANALOG-TO-DIGITAL CONVERTER (ADC) USING OVERLAPPING MULTI-PHASE CLOCKS WITH SAR-SEARCHED INPUT-CLOCK DELAY ADJUSTMENTS AND BACKGROUND OFFSET AND GAIN CORRECTION

RELATED APPLICATION

This invention is a Continuation-in-Part (CIP) of "Calibration of Timing Skews in a Multi-Channel Interleaved Analog-to-Digital Converter (ADC) by Auto-Correlation of Muxed-Together Channels in Binary Output Tree", U.S. Ser. No. 17/455,471, filed Nov. 18, 2021, hereby incorporated by reference. This invention is also a Continuation-in-Part (CIP) of "Matrix Processor Generating SAR-Searched Input Delay Adjustments to Calibrate Timing Skews in a Multi-Channel Interleaved Analog-to-Digital Converter (ADC)", U.S. Ser. No. 17/537,460, filed Nov. 29, 2021, hereby incorporated by reference.

FIELD OF THE INVENTION

This invention relates to Analog-to-Digital Converters (ADC), and more particularly to timing and calibration of interleaved ADCs.

BACKGROUND OF THE INVENTION

Analog-to-Digital Converters (ADCs) are widely used to convert analog signals to digital values. Multi-bit ADCs have a high resolution, and its accuracy can be improved by calibration. Higher sampling rates can be achieved by interleaving two ADCs that each operate at half of the sampling rate.

FIG. 1 shows a prior-art interleaved ADC. ADC 10 and ADC 12 are interleaved, with ADC 10 sampling analog input AIN when clock CLK closes switch 20, and ADC 12 sampling analog input AIN when inverse clock CLKB closes switch 22. Mux 18 selects digital output Y1 from ADC 10 when CLK is high, when ADC 10 has had sufficient time to sample and hold AIN and convert it to a digital value. The digital output DOUT is Y2 when CLK is low to mux 18. Thus, each of ADC 10, 12 can operate at half the data rate of the final output DOUT.

FIG. 2 is a graph of analog sampling and clock skew. AIN is sampled into ADC 10 to generate Y1[K−1] and Y1[K] on the falling edges of CLK, while AIN is sampled into ADC 12 to generate Y2[K−1] and Y2[K] on the falling edges of CLKB, where K is the sample or time-index number. The sampling time or period of AIN is Ts. Ideally there is no clock skew in CLK, and all samples are separated by Ts. However, CLK may not have a pulse width that is exactly 50% of period 2*Ts, introducing sampling pulse-width mismatch and non-linearities. Sampling of channel Y2 may be delayed relative to sampling of channel Y1 by Ts+ΔT/2, while Sampling of channel Y1 may be delayed relative to sampling of channel Y2 by Ts−ΔT/2. Ideally ΔT=0 without mismatch on sampling. However, in reality ΔT is finite. It is desired to reduce ΔT to a minimal acceptable level for more than 2 channels.

ADC 10, 12 and switches 20, 22 may not be exactly matched, introducing finite bandwidth mismatches among the two channels Y1, Y2. Thus, both sampling-pulse mismatches and ADC component mismatches may contribute to nonlinearities.

FIG. 3 is a graph of spurious tones in a spectrum for a prior-art interleaved ADC. Sampling pulse-width mismatches and component mismatches may introduce non-linearities or errors that cause spurious tones 302. These spurious tones can occur at integer multiples of Fs/N, K*Fs/N±F, wherein K is an integer, where Fs is the sampling frequency (period Ts=1/Fs), F is the input frequency of a tone, and N is the number of channels interleaved together. These spurious tones are undesirable since they can restrict the dynamic range of high-speed ADCs and are proportional to analog input signal amplitude and frequency.

What is desired is a highly-interleaved ADC with at least 3 ADC channels interleaved together for operation at higher sampling rates. It is desired to introduce a variable, programmable delay to each of the channel inputs to correct for timing skews caused by sampling pulse-width, clock, and component mismatches among the 3 or more channels interleaved together. A calibration method is desired to test various values of these delays to program these delays to minimize the skew among the multiple channels. Both a rapid foreground calibration method and a background calibration method to adjust for gradual temperature skews are desired. It is further desired to use higher sampling clock rates.

BRIEF DESCRIPTION OF THE DRAWINGS

FIG. 1 shows a prior-art interleaved ADC.

FIG. 2 is a graph of analog sampling and clock skew.

FIG. 3 is a graph of spurious tones in a spectrum for a prior-art interleaved ADC.

DETAILED DESCRIPTION

The present invention relates to an improvement in interleaved ADC timing and calibration. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

Figure 4:
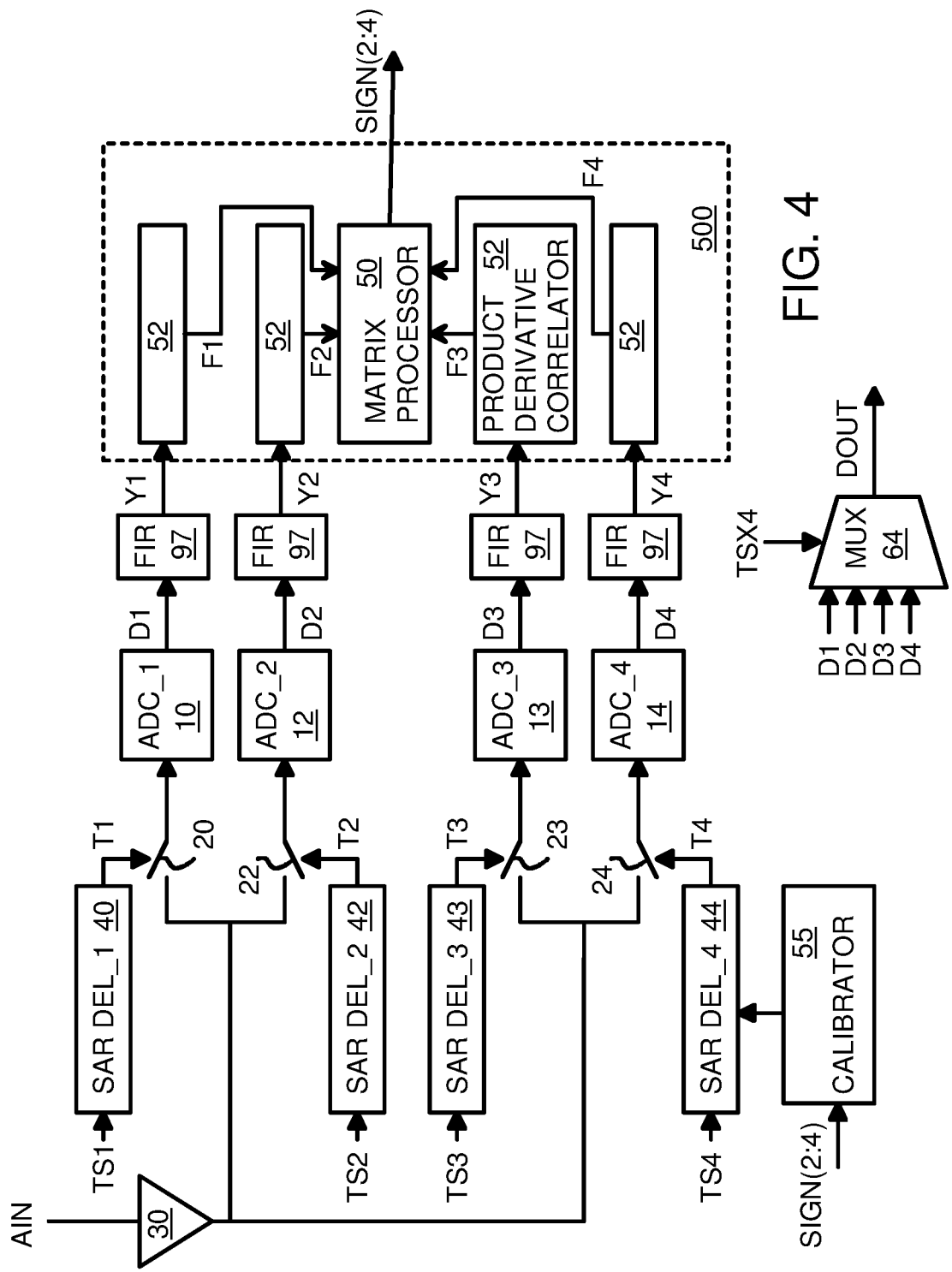
FIG. 4 is a block diagram of a 4-channel interleaved ADC with product derivative correlators and a matrix processor for calibration of programmable input delays.

FIG. 4 is a block diagram of a 4-channel interleaved ADC with product derivative correlators and a matrix processor for calibration of programmable input delays. Analog input AIN is buffered by analog buffer 30 and sampled by switches 20, 22, 23, 24 into ADC 10, 12, 13, 14 that generate digital values D1, D2, D3, D4, respectively. Mux 64 alternately selects D1, D2, D3, D4 to generate the final data output DOUT. Final mux 64 operates with clock TSX4 that has four times the frequency of sampling clock TS1.

Sampling clocks TS1, TS2, TS3, TS4 can be a four-phase clock all operating at the same frequency but with phase shifts of 0, 90, 180, and 270 degrees. Sampling clocks TS1, TS2, TS3, TS4 are delayed by variable delays to generate clocks T1, T2, T3, T4 that control switches 20, 22, 23, 24, respectively, that sample AIN to ADC 10, 12, 13, 14 that generate channel digital outputs D1, D2, D3, D4, having phases of 0, 90, 180, and 270 degrees. These variable delays are programmed during calibration with digital values that are stored in a Successive-Approximation-Register (SAR) that enable and disable binary-weighted capacitor delay elements. Calibration uses a Successive-Approximation method testing larger, Most-Significant Bit (MSB) capacitors first, then testing successively smaller capacitors until a Least-Significant Bit (LSB) capacitor is tested.

SAR delay 40 delays sampling clock TS1 to generate T1 to switch 20, while SAR delays 42, 43, 44 delay sampling clocks TS2, TS3, TS4 to generate T2, T3, T4 to switches 22, 23, 24, respectively. By adjusting the delay values programmed into SAR delays 40, 42, 43, 44, the timing skews between channels D1, D2, D3, D4 can be compensated for and matched to within the delay of 1 LSB capacitor in SAR delay 40, 42, 43, 44.

Finite-Impulse-Response (FIR) filters 17 filter digital outputs D1, D2, D3, D4 from ADC 10, 12, 13, 14 to generate filtered digital values Y1, Y2, Y3, Y4. FIR filters 17 can act as lowpass or bandpass filters for calibration.

Product derivative correlators 52 receive filtered digital values Y1, Y2, Y3, Y4 and generate product derivative factors F1, F2, F3, F4. The product derivative factor F2 is a function of the current channel filtered digital value Y2, and the adjacent channels Y1, Y3. In general, the product derivative factor F(X) for a channel X has inputs Y(X), Y(X−1), and Y(X+1), where X−1 and X+1 are modulo N, where N is the number of interleaved channels. Each product derivative correlator 52 generates a correlation factor of the current channel compared to the two adjacent channels. Product derivative correlator 52 can be a mid-point correlator such as shown by the logic implemented of FIG. 6.

Matrix processor 50 receives product derivative factors F1, F2, F3, F4 from product derivative correlators 52, and forms a matrix from F1, F2, F3, F4 that is multiplied by a correlation matrix to generate sign bits. The correlation matrix is constant matrix that is fixed for a fixed number of channels N.

During calibration, the delay in SAR delay 40 is fixed and acts as a timing reference for the other N−1 channels. Therefore, the sign bit for channel 1 is not generated by matrix processor 50.

For a constant or slow-moving analog input AIN, all channels should generate the same filtered digital values Y1, Y2, Y3, Y4. Differences in these values among channels can indicate skews or timing differences.

Product derivative factors F1, F2, F3, F4 each indicate a digital value or timing difference between a channel and its two adjacent channels. These timing differences are combined with all other timing differences by matrix processor 50 to generate the sign bits. The sign bits indicate which channels have larger delays, and which channels have smaller delays.

Calibrator 55 uses these sign bits during a successive-approximation sequence to decide when to keep a test bit set in SAR delay 42, 43, 44 and when to reset the test bit, as successively smaller bit-positions are tested.

The parent application, U.S. Ser. No. 17/537,460, describes the operation of matrix processor 50 and product derivative correlators 52 in more detail, which form channel correlator 500. Another embodiment of channel correlator 500 uses a binary tree of auto-correlators, and is described in another parent application, U.S. Ser. No. 17/455,471.

Figure 5:
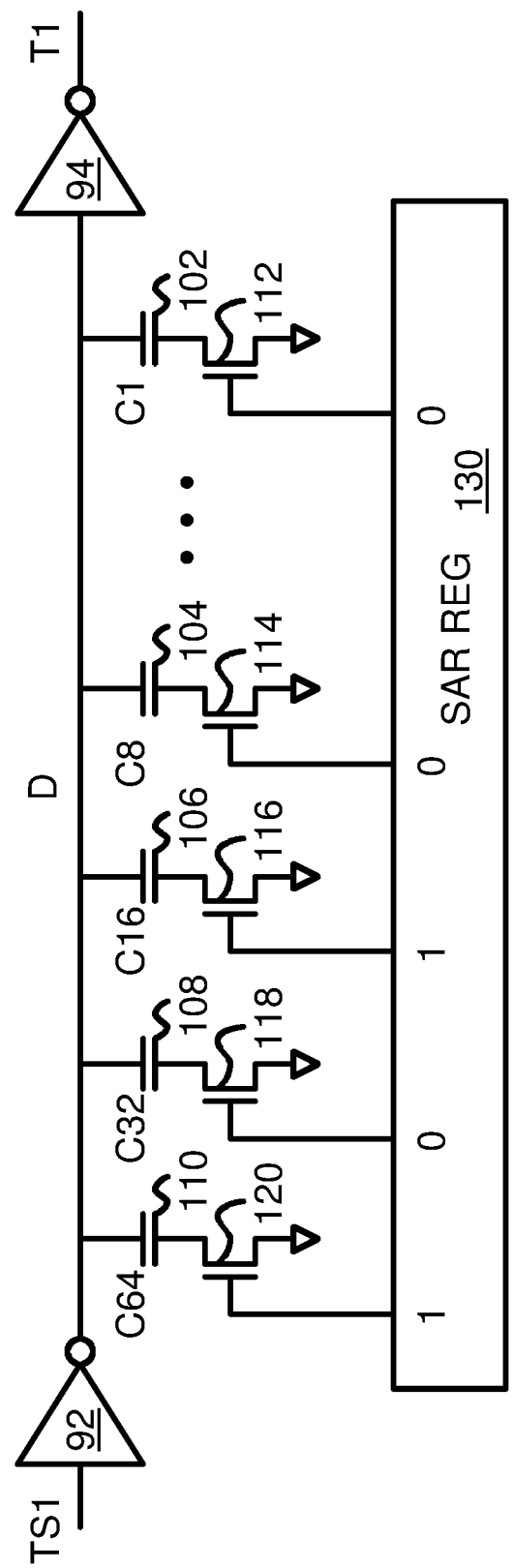
FIG. 5 is a diagram of a SAR delay element with binary-weighted capacitors.

FIG. 5 is a diagram of a SAR delay element with binary-weighted capacitors. SAR delay 40 has input inverter 92 that inverts input sampling clock TS1 to drive delay node D, and output inverter 94 that drives local sampling clock T1 for channel 1.

A series of binary-weighted capacitors 110, 108, 106, 104, . . . 102 have capacitance values or weights of 64, 32, 16, 8, 4, 2, and 1 times a minimum capacitor value of C, C1 capacitor 102. All of binary-weighted capacitors 110, 108, 106, 104, . . . 102 have one terminal that connects to delay node D between inverters 92, 94, and another terminal connected to ground through enabling transistors 120, 118, 116, 114, . . . 112. Bits in SAR register 130 drive the gates of enabling transistors 120, 118, 116, 114, . . . 112. When the bit in SAR register 130 is high, the enabling transistor is turned on, connecting the lower terminal of the capacitor to ground, enabling the capacitor and increasing the capacitance and delay of delay node D.

For example, the value 1010000 programmed into SAR register 130 enables transistors 120, 116, and capacitors 110, 106, increasing the capacitance on delay node D by 64C+ 16C, or 80C. MSB capacitor 110 adds a 64C delay while capacitor 106 adds a 16C delay. Other SAR delays 42, 43, 44 operate in a similar manner and can each be programmed with a different SAR delay value.

Figure 6:
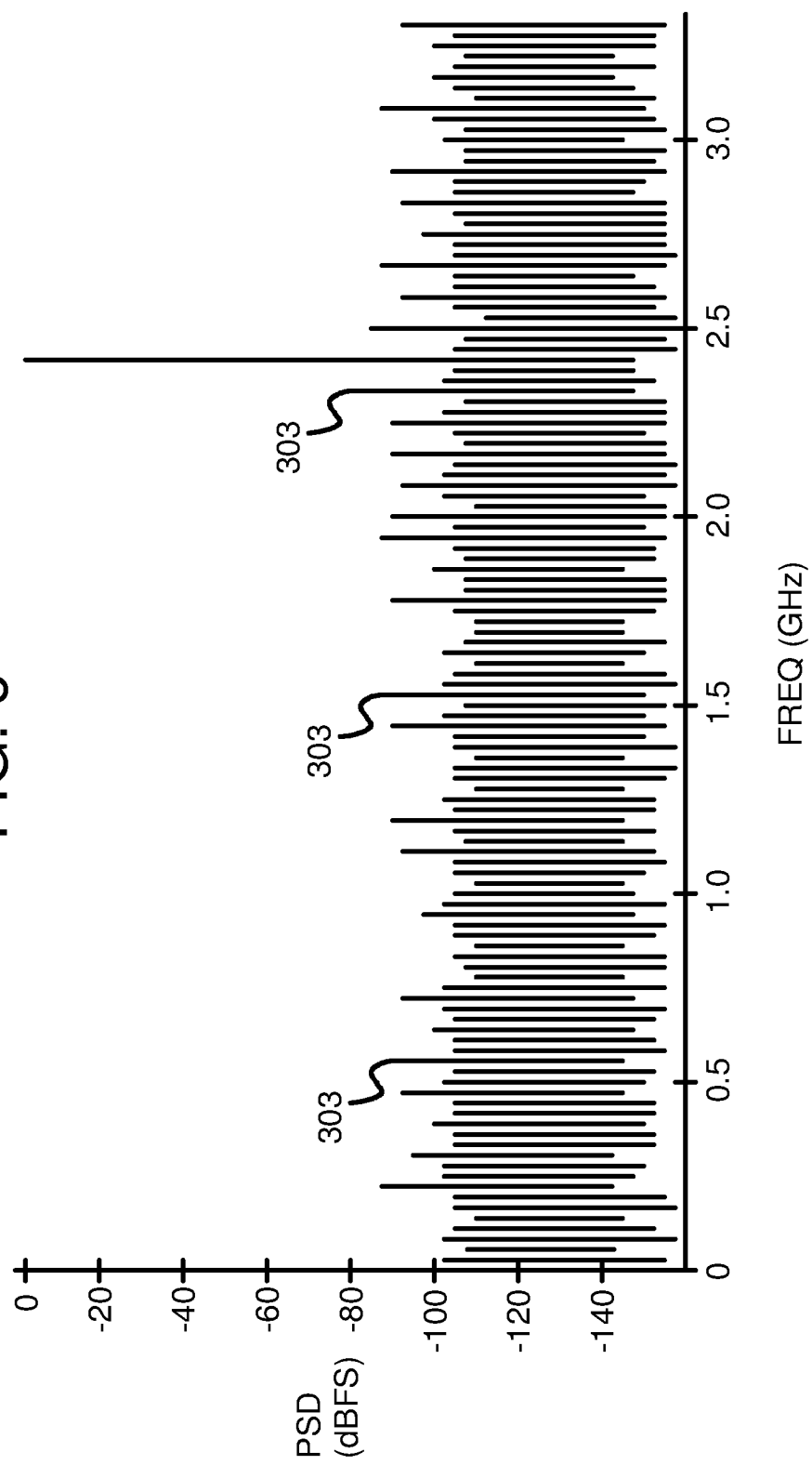
FIG. 6 is a graph of reduced spurious tones in a spectrum for an interleaved ADC with channel input delays calibrated by a channel correlator.

FIG. 6 is a graph of reduced spurious tones in a spectrum for an interleaved ADC with channel input delays calibrated by a channel correlator. Sampling pulse-width mismatches and component mismatches that introduce non-linearities or errors are compensated for by the calibration routine to adjust the programmable delays in SAR delay 40, 42, 43, 44 in the interleaved ADC shown in FIG. 4. This calibration reduces the amplitude of spurious tones 303. These spurious tones still occur at integer multiples of Fs/N, K*Fs/N±Fin, where Fs is the sampling frequency (period Ts=1/Fs) and N is the number of channels interleaved together. However, the amplitude of spurious tones 303 are reduced when compared with spurious tones 302 of the prior-art of FIG. 3.

Figure 7:
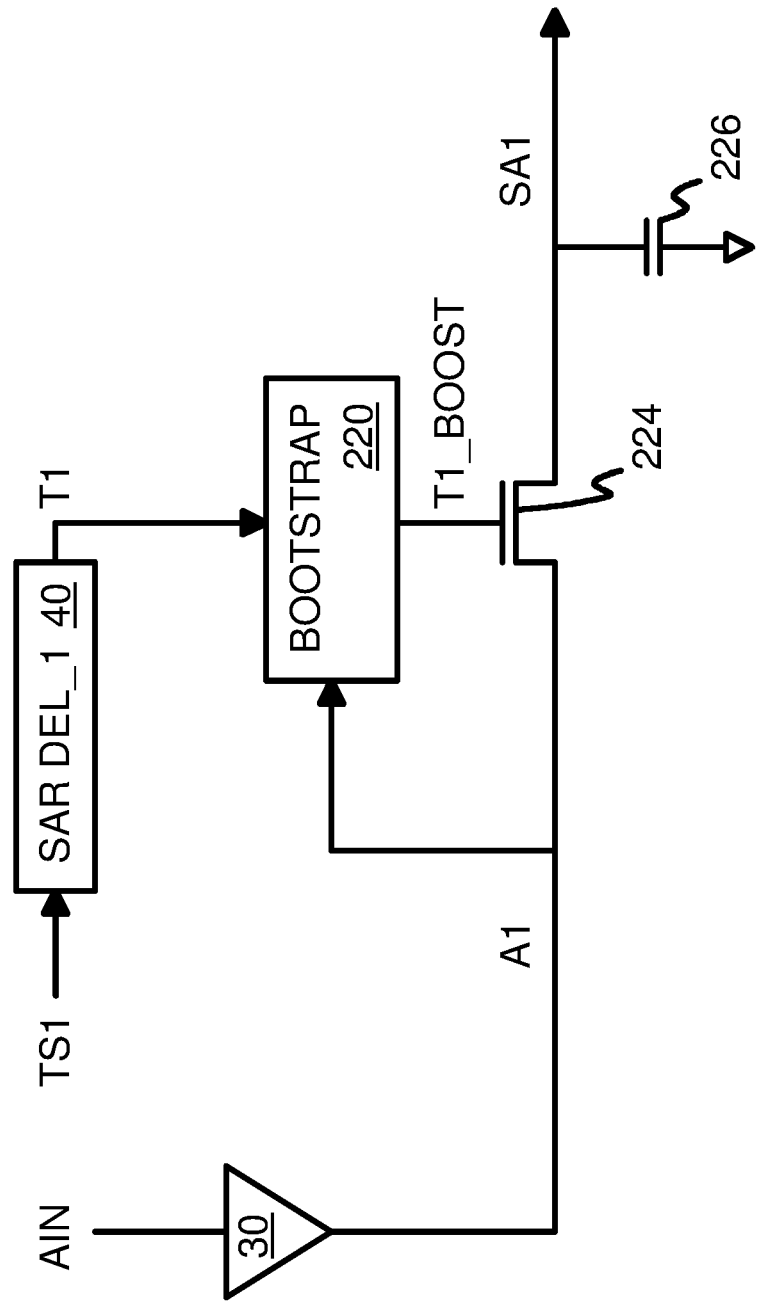
FIG. 7 shows a channel sampling using a voltage-boosted clock.

FIG. 7 shows a channel sampling using a voltage-boosted clock. The sampling clock for a channel, TS1, is delayed by a variable delay that was set during the calibration routine when the delays among the interleaved channels were correlated using channel correlator 500. This variable delay was programmed into a Successive-Approximation-Register (SAR) that controls the capacitor configuration and thus the delay of SAR delay 40. The delayed sampling clock output by SAR delay 40, T1, is input to bootstrap driver 220, which increases the high voltage of the boosted clock T1_BOOST that drives the gate of transistor 224, which acts as switch 20 (FIG. 4).

Bootstrap driver 220 can boost the gate voltage of T1_BOOST to about one power supply voltage (VDD) above the normal high logic voltage. The higher gate voltage applied to transistor 224 reduces the ON resistance of transistor 224, allowing the local input analog voltage A1 to flow more easily and quickly into sampled node SA1 to charge sampling capacitor 226. The local input analog voltage A1 can be buffered from the analog input AIN by analog buffer 30. Local input analog voltage A1 is input to bootstrap driver 220 which uses local sampling clock T1 to generate T1_BOOST.

Using bootstrap driver 220 and the boosted gate voltage for switch 20 reduces the ON resistance of switch 20. This can improve timing margins, allowing for higher sampling rates when all interleaved channels use voltage-boosted delayed clocks.

Figure 8:
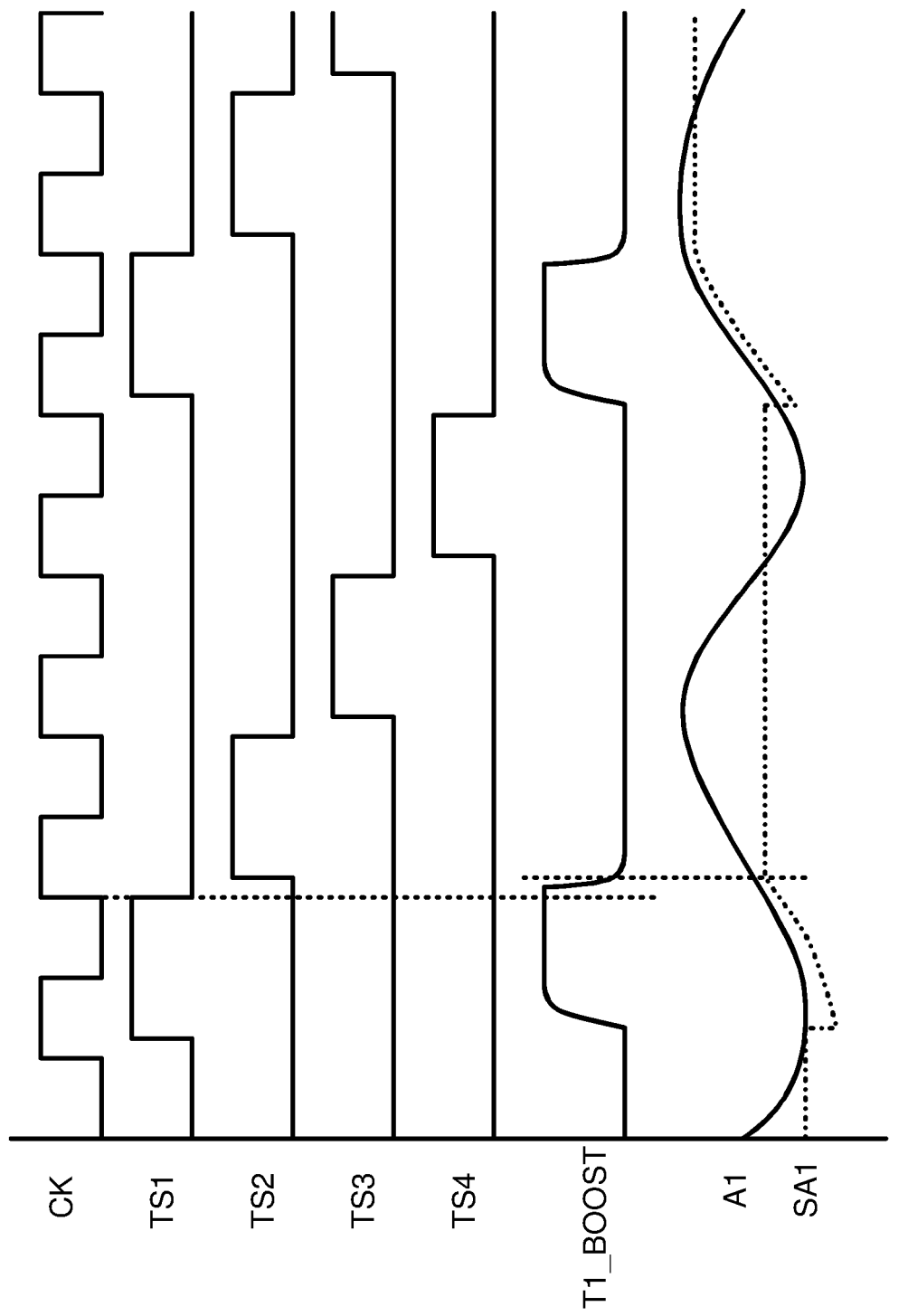
FIG. 8 shows non-overlapping clocks that sample interleaved ADC channels.

FIG. 8 shows non-overlapping clocks that sample interleaved ADC channels. Non-overlapping multi-phase clocks are typically used. In this simplified 4-channel interleaved ADC, sampling clocks T1, T2, T3, T4 are non-overlapping, allowing each of the four channels to be sampled at a separate time slot.

However, when boosted gate voltages are applied to the sampling switches, more time is required for the boosted gate voltage to reach the boosted high voltage than when non-boosted high voltages are used. T1_BOOST requires additional time to slew high and low, resulting in longer rise times and fall times. This can be noticeable especially at higher clock and sampling rates. For example, the rise time can be 20-30 picoseconds (ps), and the fall time can be 10-15 ps. At 16 G samples per second, the sampling period is 62.5 ps, so the voltage is stable less than half of the period.

Sampling clock T1 is delayed by the variable delay in SAR delay 40 and boosted in voltage by bootstrap driver 220 to generate T1_BOOST. The falling edge of T1_BOOST is used to sample the analog input, local input analog voltage A1.

At the rising edge of T1_BOOST, switch 20 opens, allowing charge to pass through transistor 224 in either direction. When sampling capacitor 226 is initially charged to a higher voltage than A1, charge sharing through transistor 224 can cause A1 to initially dip as T1_BOOST rises. Also switch noise from the rising gate voltage of transistor 224 can be coupled into SA1 and A1, causing a voltage dip in either or both of A1 and SA1.

After T1_BOOST has reached the boosted high voltage, transistor 224 is fully on and analog buffer 30 can drive A1 to compensate for any voltage change caused by switch turn-on. Eventually analog buffer 30 drives A1 to the same voltage of analog input AIN, and also drives sampled node SA1 through transistor 224 to this same analog voltage.

However, for very fast clocks, analog buffer 30 may not have sufficient time to drive the correct analog voltage through transistor 224. Sampled node SA1 may still not be equal to local input analog voltage A1 when the falling edge of T1_BOOST occurs. When switch 20 closes as T1_BOOT falls, SA1 might not yet be equalized to A1. The wrong voltage is sampled.

Although the voltage difference may be slight, for high-accuracy ADCs, this sampling error is a problem. Such a sampling error may limit the maximum sampling clock frequency of the ADC. It is desired to increase the maximum sampling clock frequency by reducing or eliminating this sampling error.

Figure 9:
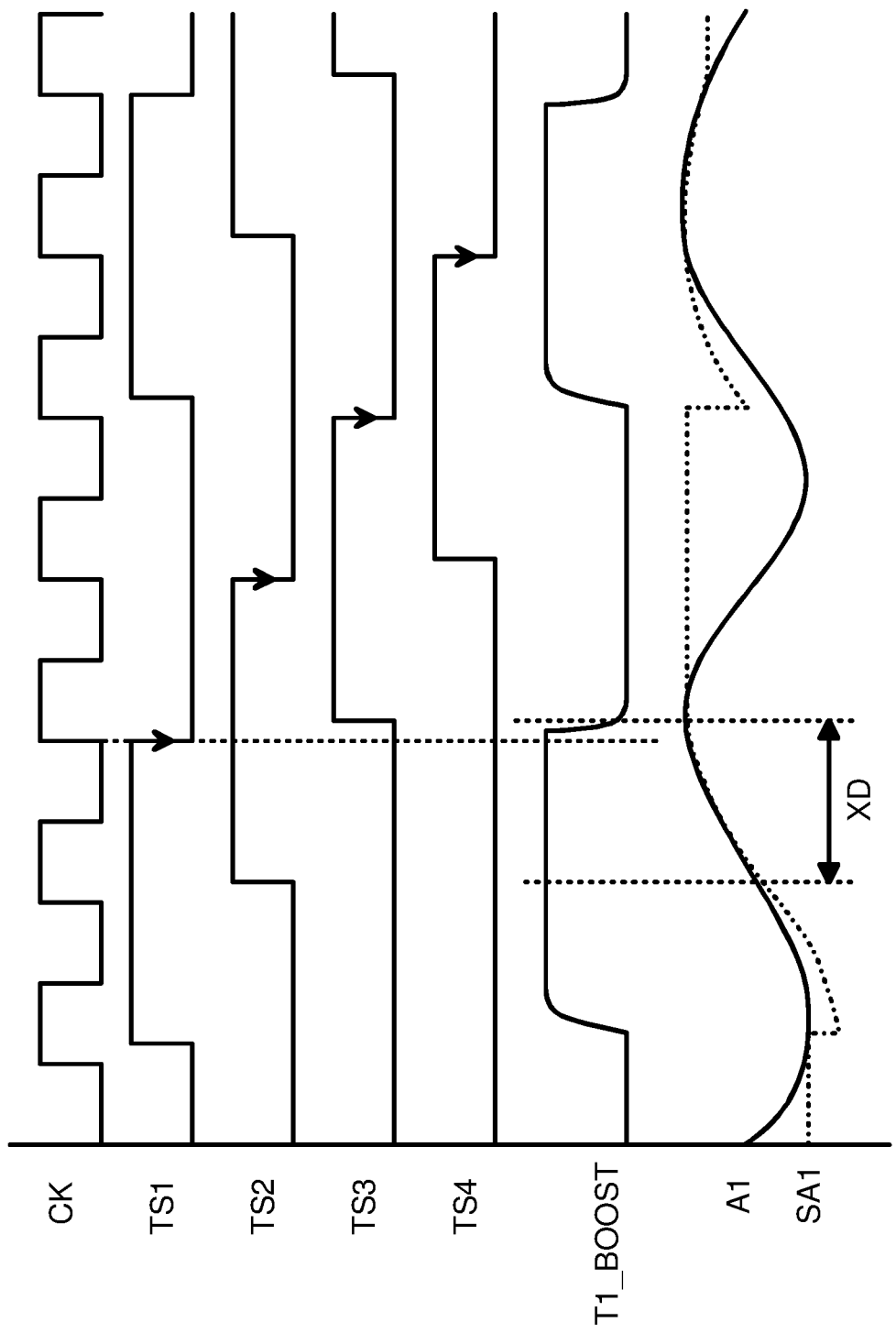
FIG. 9 is a waveform showing overlapping multi-phase clocks being used for sampling an ADC.

FIG. 9 is a waveform showing overlapping multi-phase clocks being used for sampling an ADC. The inventor has realized that allowing the multi-phase clocks to overlap can provide additional time for the sampling switches to equalize analog voltages. In particular, the inventor widens the pulse widths of the non-overlapping multi-phase clocks to make these clock overlapping.

While in FIG. 8, each of the sampling clocks T1, T2, T3, T4 were high for one pulse of clock CK, now in FIG. 9 each of the sampling clocks T1, T2, T3, T4 are high for two pulses of clock CK. Sampling occurs on the falling edges of sampling clocks T1, T2, T3, T4, and one sample is taken for each period of clock CK, as was true for FIG. 8. However, one additional period of CK is provided to each sampling switch to allow for voltage equalization to complete.

The rising edge of T1_BOOST is generated two periods of clock CK before the falling edge of T1_BOOST. At the rising edge of T1_BOOST, transistor 224 turns on and starts to equalize local input analog voltage A1 and sampled analog voltage SA1. Transistor 224 remains open when T1_BOOST is high, for two periods of clock CK. At the falling edge of T1_BOOST, transistor 224 turns off, disconnecting sampled analog voltage SA1 from local input analog voltage A1 and storing the sampled voltage SA1 on sampling capacitor 226.

Since there is an added extra delay XD before switch 20 closes, there is added time for voltage equalization through transistor 224. Larger voltage dips when switch 20 opens can be tolerated since there is more time for analog buffer 30 to drive current and compensate.

With the longer pulse widths of the sampling clocks and T1_BOOST, sampled analog voltage SA1 can be fully equalized with local input analog voltage A1 before the falling edge of T1_BOOST. When boosted voltages T2_BOOST, T3_BOOST, and T4_BOOST (not shown) are generated and used in a similar way for the other 3 channels, higher frequencies of operation can be supported. A higher clock rate for CK may be used for the overlapping multi-phase clocks of FIG. 9 than for the non-overlapping multi-phase clocks of FIG. 8.

The sampling points are the falling edges of the sampling clocks. These sampling points are still only one sampling period Ts apart even though the clocks overlap. The overall sampling rate is Fs=1/Ts.

Figure 10:
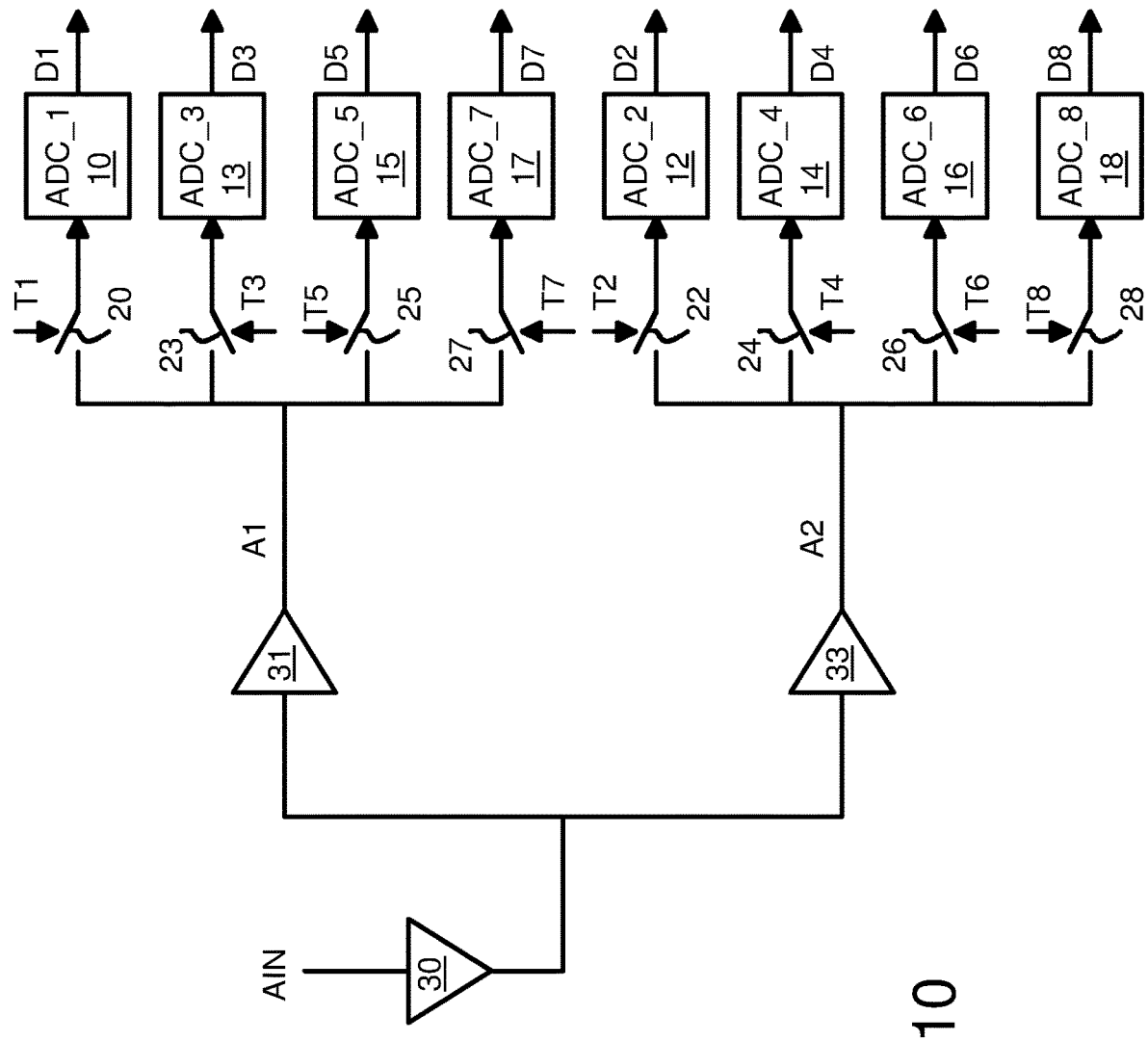
FIG. 10 shows a binary tree of analog input buffers driving interleaved ADC channels.

FIG. 10 shows a binary tree of analog input buffers driving interleaved ADC channels. Rather than have one analog buffer 30 drive all 8 channels of ADC, the ADC channels are divided into groups of 4 channels that are each driven by a separate analog buffer. The analog input AIN is first buffered by analog buffer 30 to drive the inputs to second-level analog buffers 31, 33. Second-level analog buffer 31 drives local input analog voltage A1 to switches 20, 23, 25, 27 for four channels of ADC 10, 13, 15, 17 that generate odd-channel digital outputs D1, D3, D5, D7, respectively.

Another second-level analog buffer 33 drives local input analog voltage A2 to switches 22, 24, 26, 28 for four channels of ADC 12, 14, 16, 18 that generate even-channel digital outputs D2, D4, D6, D8, respectively. Eight overlapping multi-phase clocks T1, T2, T3, . . . T8 are generated to control switches for the 8 channels.

Figure 11:
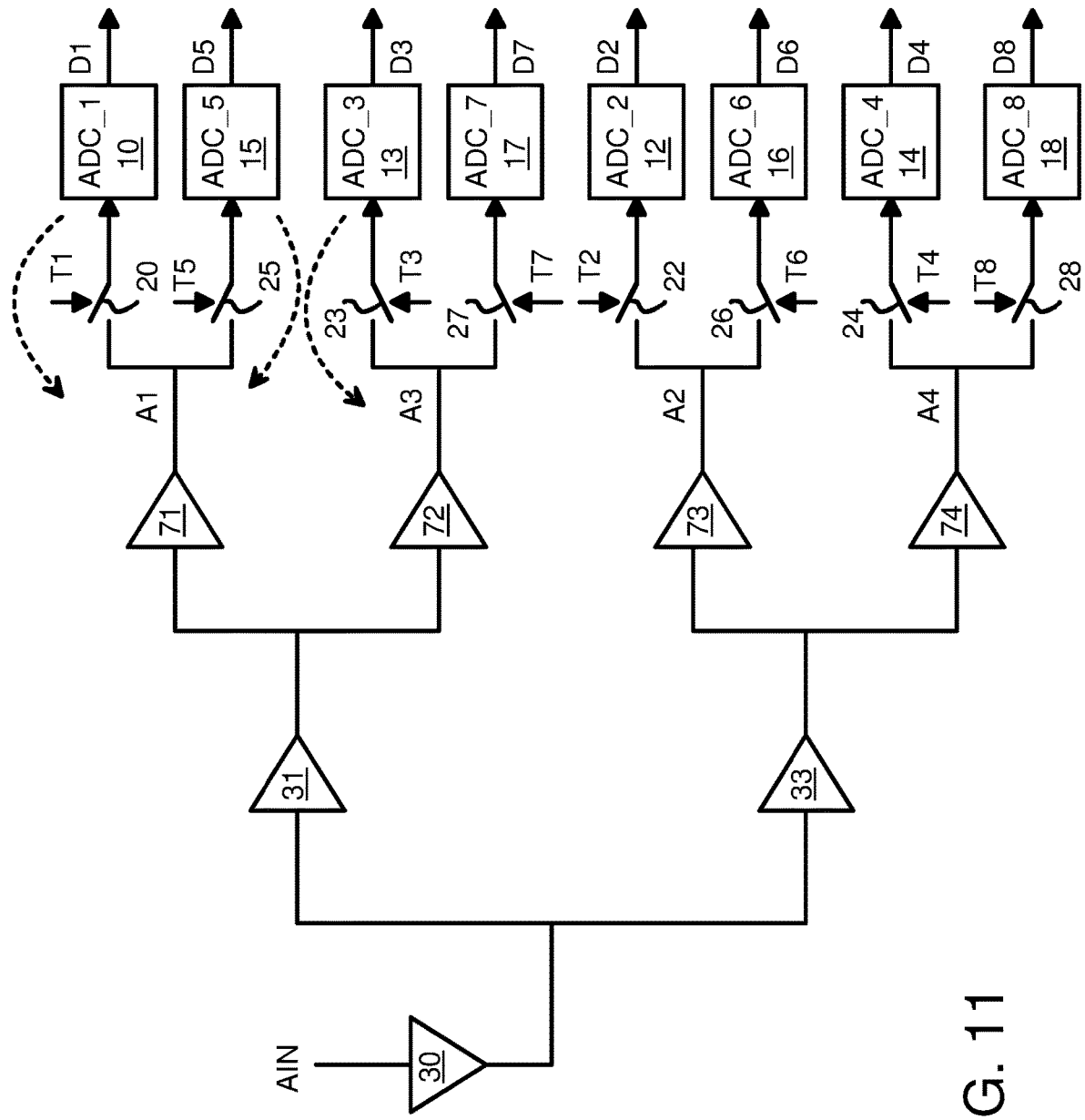
FIG. 11 shows a deeper binary tree of analog input buffers driving interleaved ADC channels.

FIG. 11 shows a deeper binary tree of analog input buffers driving interleaved ADC channels. The ADC channels are divided into pairs channels that are each driven by a separate analog buffer. The analog input AIN is first buffered by analog buffer 30 to drive the inputs to second-level analog buffers 31, 33. Second-level analog buffer 31 drives the inputs of third-level analog buffers 71, 72. Another second-level analog buffer 33 drives the inputs of third-level analog buffers 73, 74.

Third-level analog buffer 71 drives local input analog voltage A1 to switches 20, 25 for 2 channels of ADC 10, 15 that generate digital outputs D1, D5, respectively. Third-level analog buffer 72 drives local input analog voltage A3 to switches 23, 27 for 2 channels of ADC 13, 17 that generate digital outputs D3, D7, respectively.

For the even channels, third-level analog buffer 73 drives local input analog voltage A2 to switches 22, 26 for 2 channels of ADC 12, 16 that generate digital outputs D2, D6, respectively. Third-level analog buffer 74 drives local input analog voltage A4 to switches 24, 28 for 2 channels of ADC 14, 18 that generate digital outputs D4, D8, respectively.

Using a binary tree of analog buffers 30, 31, 33, 71, 72, 73, 74 reduces the effective load on the final-level analog buffers 71, 72, 73, 74, since each has to drive only 2 channels. Without the binary tree, a single analog buffer 30 drives all channels, such as the 8 channels in this example. Thus the effective loading is reduced by a factor of 4 in the example of FIG. 11.

Cross-talk can occur from kick-back charges from one ADC channel to another ADC channel. For example, ADC 10 could generate kick-back charges that pass through switch 20 to node A1, which can pass through switch 25 to disturb ADC 15.

Such cross-talk paths among channels are also reduced by the binary tree of analog buffers 30, 31, 33, 71, 72, 73, 74. For example, in FIG. 11 channels 1 and 5 have cross-talk paths through switches 20, 25 and node A1. However, since only 2 switches connect to node A1, cross-talk is limited to 2 channels. If all 8 switches 20-27 for all 8 channels are connected together at node A1, then cross-talk can occur for any of the 8 channels to any of the other 7 channels.

Feedthrough or kickback can also occur through parasitic capacitances in any of analog buffers 30, 31, 33, 71, 72, 73, 74, from output back to input. This kickback can destroy the linearity of the analog input signal. However, have an upstream analog buffer helps suppress this kickback from traveling further back through the earlier levels of the binary tree of analog buffers 30, 31, 33.

Having binary tree of analog buffers 30, 31, 33, 71, 72, 73, 74 also provides a wider input signal bandwidth. A single analog buffer 30 needs to drive all N channels. This high loading restricts the achievable bandwidth. When using binary tree of analog buffers 30, 31, 33, 71, 72, 73, 74, analog buffer 30 drives a constant small load of second-level analog buffers 31, 33. The bandwidth of analog buffer 30 can be made with a very wide input signal bandwidth. Similarly, reducing the loading on second-level analog buffers 31, 33 helps reduce the input loading on second-level analog buffers 31, 33. Also, a long sampling time frame helps reduce the loading of the sampler. A 10 GHz signal bandwidth is feasible in such an architecture for a same power consumption.

There is a tradeoff in multi-bank buffer trees. Normally push-pull source followers are adopted for high sampling rate ADCs. There is an insertion loss on each buffer, but with careful design, it can achieve a 1.2 dB insertion loss in band. So, a three-deep cascade of buffers may result in a 3.6 dB loss on signal swing. In most situations, in wideband applications such as a Software Defined Ratio (SDR) transceiver, 2.5-3.5 dB insertion loss is acceptable. A two-level-deep cascade of buffers is a more preferrable design. Also, there are input amplifiers such as a Low Nosie Amplifier (LNA) or a Programmable Gain Amplifier (PGA) or a Variable Gain Amplifier (VGA) in front of the ADC input to amplify the signal swing before data conversion. A signal swing of 1.4 Vpp is not hard to achieve in modern communication transceiver systems.

Figure 12:
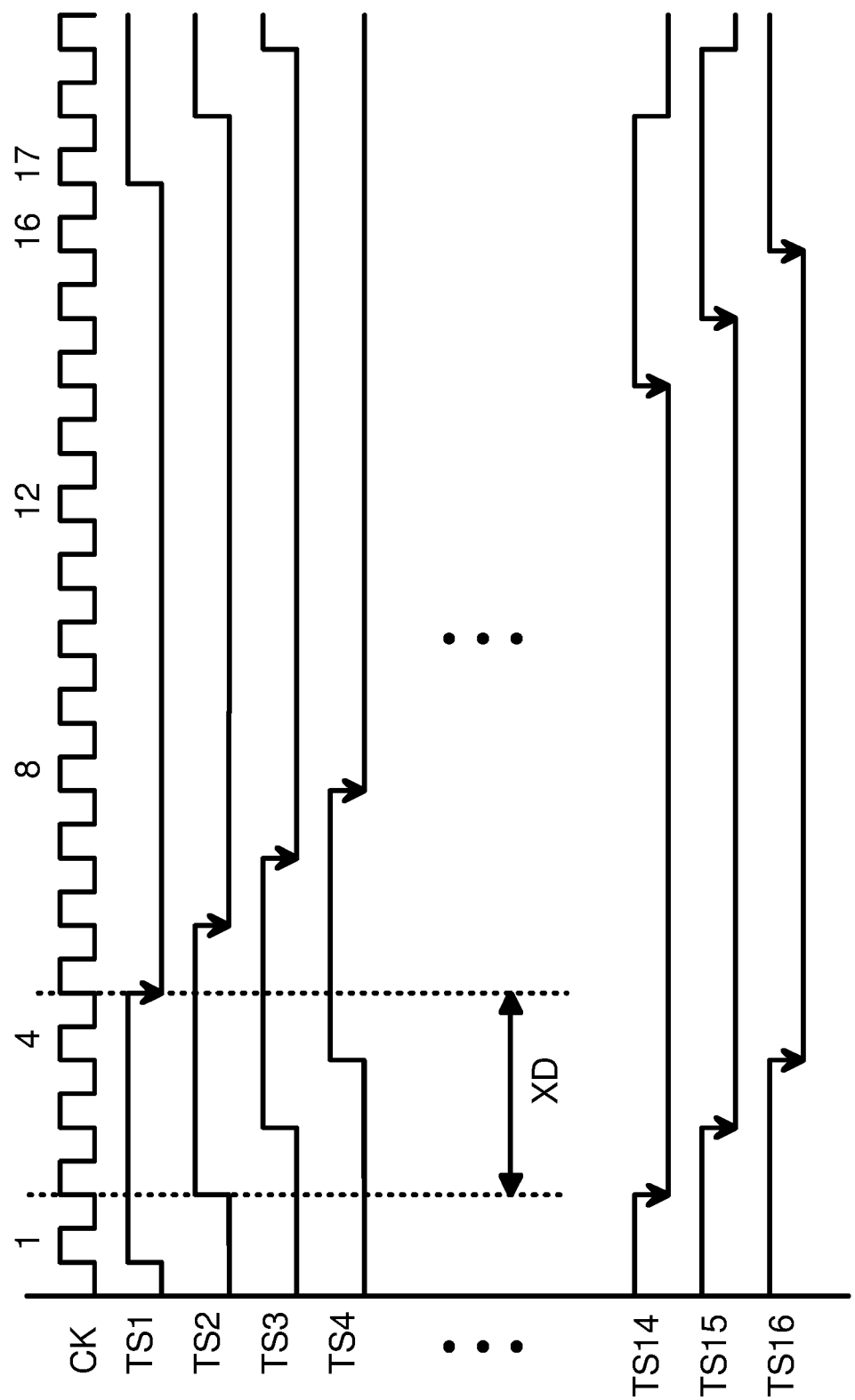
FIG. 12 is a waveform diagram of a quadruple-delay multi-phase overlapping sampling clocks for an interleaved ADC.

FIG. 12 is a waveform diagram of a quadruple-delay multi-phase overlapping sampling clocks for an interleaved ADC. In this variation, the width of sampling clock TS1 is increased by a factor of 4, to have a pulse-width of four CK clock periods. An extra delay XD of 3 periods of clock CK is added. Voltage equalization through each of the sampling switches is allotted four periods of clock CK.

While each of the double-delay sampling clocks of FIG. 9 overlapped with two adjacent channels' sampling clocks, now each sampling clock overlaps with 6 nearby channels' sampling clocks, the 3 prior channels and the 3 subsequent channels. For example, channel 4 sampling clock TS4 overlaps with previous channel sampling clocks TS1, TS2, TS3, and subsequent channel sampling clocks TS5, TS6, TS7. This increased depth of pipelining relaxes timing constraints and allows for faster clock rates to be used.

Figure 13:
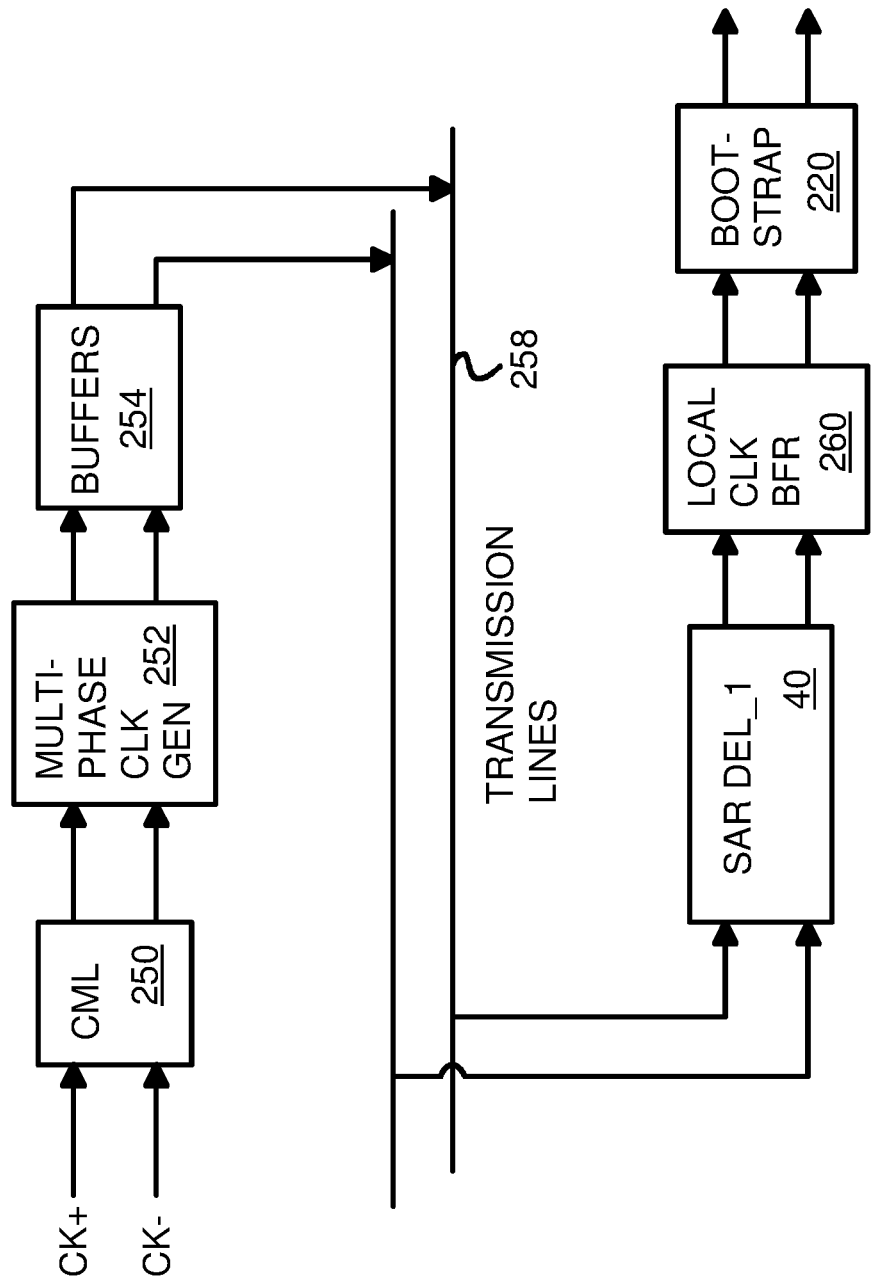
FIG. 13 shows global and local sampling clock distribution.

FIG. 13 shows global and local sampling clock distribution. Differential rather than single-ended clocks may be used for some or all stages in the clock network, especially for long transmission lines 258. A reference clock CK+, CK− is applied to Current-Mode-Logic (CML) driver 250 that generates a full-swing CMOS differential clock, which then drives multi-phase clock generator 252 that generates N oversampling clocks with N different phases, such as sampling clocks TS1, TS2, TS3 . . . TS8. Buffers 254 drive these N clocks over transmission lines 258, which can be longer bus lines within a large Integrated Circuit (IC) that have higher capacitances.

A multi-phase clock generator can be implemented by multi-phase dividers that not only create 4 or 8 or 16 phase clocks for a time-interleaved ADC but also ensure a 50%-50% duty cycle of the multi-phase clocks with a relaxed requirement on CK+, CK−.

Each channel ADC may be in a different physical location on a larger IC die. The different phase clocks are routed over transmission lines 258 to these local locations and then delayed by the calibrated delay programmed into SAR delay 40 for that channel. Local clock buffers 260 generate delayed clock T1 from sampling clock TS1 using the delay time programmed into SAR delay 40. Bootstrap driver 220 then generates T1_BOOST from T1.

Jitter and timing skew mismatch can be designed to be very small since clock path elements can use larger transistors as needed. Local clock generation can use simple combinatorial logic gates such as NAND, NOR, etc. Physically placing SAR delay 40 near local clock buffers 260 and bootstrap driver 220 allows timing skews from transmission lines 258 to be included in calibration that adjusts the delay programmed into SAR delay 40 near switch 20 for that channel ADC.

Figure 14:
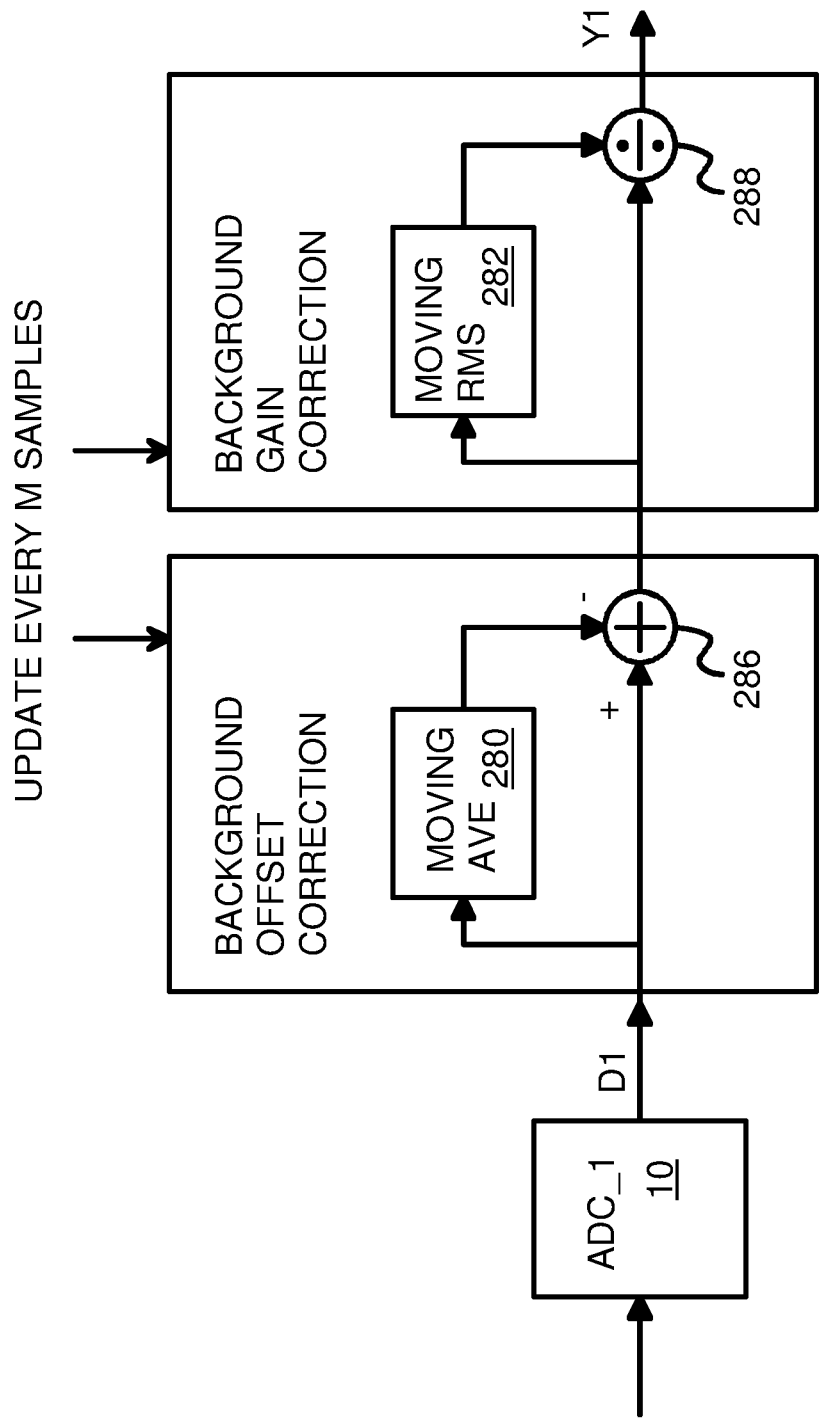
FIG. 14 shows background offset and gain correction.

FIG. 14 shows background offset and gain correction. Offset and gain mismatches caused by mismatches within the binary tree of analog buffers 30, 31, 33, 71, 72, 73, 74 can be corrected for by subtracting an average over M samples for each ADC channel. ADC 10 generates digital output D1 that has offset and gain mismatches. A moving average of D1 is generated by moving averager 280 over M samples, and this moving average is subtracted by subtractor 286 from D1.

A moving Root-Mean-Square (RMS) of D1 is generated over M samples by moving RMS generator 282, and the offset-corrected digital output D1 is divided by this moving rms value by divider 288 to generate normalized digital output Y1 for channel 1. Each channel is separately corrected for offset and gain in a similar manner. These are updated after every M samples.

The added advantage for this parallel digital implementation is that it can reduce the running clock rate for each sub-ADC by Fs/N for a N-channel time-interleaved ADC. This can help the entire ADC to operate at a super high sampling rate at a low power consumption.

Figure 15:
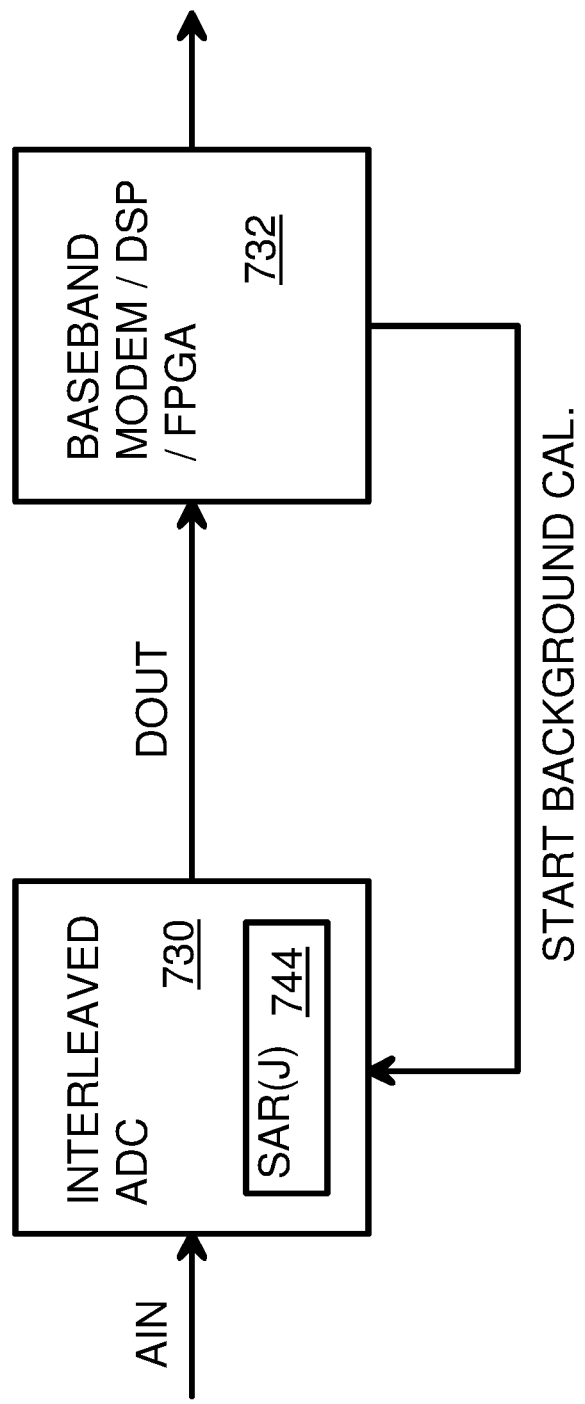
FIG. 15 shows a backend processor triggering background calibration of an interleaved ADC.

FIG. 15 shows a backend processor triggering background calibration of an interleaved ADC. Foreground calibration can be triggered on power-up, initialization, or a reset. This foreground calibration uses product derivative correlators and a matrix processor with calibrator 55 to perform Successive-Approximation searches that load delay values into SAR delay registers 744 in interleaved ADC 730 to compensate for timing skews among ADC channels in interleaved ADC 730.

Temperature and voltage conditions can drift over time. Switches, delays, ADCs, and other components and their errors can be temperature and voltage dependent. The circuitry in interleaved ADC 730 is sensitive to temperature and voltage. Over time, as the system heats up or as the environment changes, temperature and supply-voltage changes may cause increased timing skews in interleaved ADC 730. As conditions drift, the calibrated delays may need to be updated to compensate for this drift. Background calibration can be triggered periodically to compensate for these drifts.

Downstream device 732 could be a baseband modem, a Digital Signal Processor (DSP), a Field-Programmable Logic Array (FPGA), or other device that uses the digital output DOUT from interleaved ADC 730. Downstream device 732 may include logic that detects when temperature, voltage, or other conditions have changed and trigger interleaved ADC 730 to perform background calibration. Downstream device 732 could have a timer and trigger background calibration after some period of time, such as hourly or daily. Downstream device 732 could detect idle times or times when the analog input AIN has a suitable signal strength and frequency for calibration. Pattern-generation logic integrated with interleaved ADC 730 may also be enabled to generate suitable analog input AIN signals for calibration.

Figure 16:
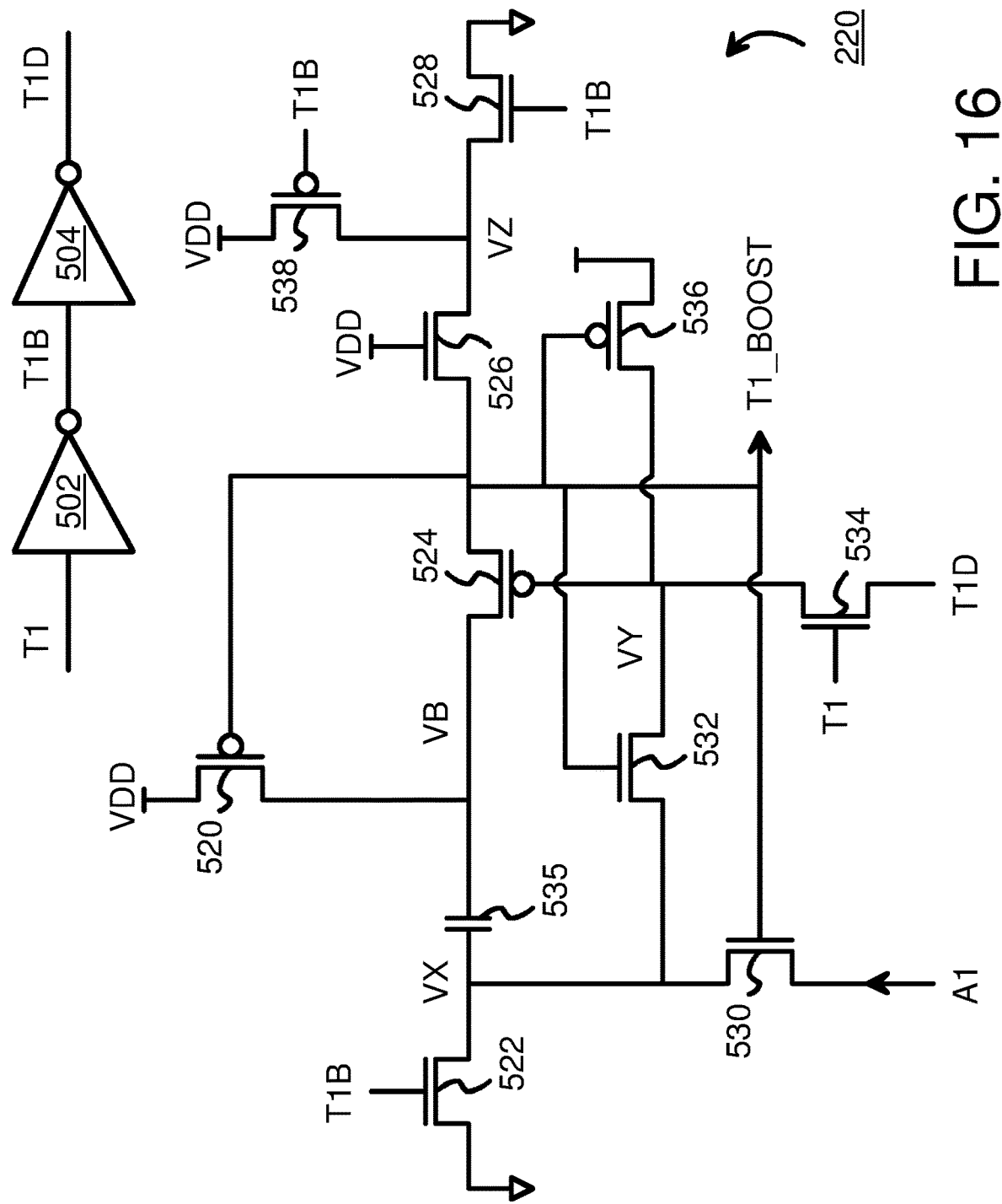
FIG. 16 is a schematic of a bootstrap driver.

FIG. 16 is a schematic of a bootstrap driver. The sampling clock for this channel, such as T1, is inverted by inverter 502 to generate T1B and then inverted again by inverter 504 to generate delayed clock T1D. A precharge phase occurs when T1 is low, while the boost phase occurs when T1 is high.

During precharge, transistor 528 turn on to discharge node VZ and also node T1_BOOST through transistor 526. Transistor 522 also turns on to discharge VX. Transistors 530, 532, 534, are off. Transistor 536 turns on and pulls node VY high to VDD, which gradually turns off transistor 524. Transistor 520 turns on and pulls node VB high to VDD. Capacitor 535 is precharged to VDD, while ground on node VX and VDD on node VB.

When T1 goes high, the boost phase occurs. Transistors 522, 528 turn off. Transistor 538 turns on to drive VZ to VDD to protect the source of transistor 526 so that its drain-to-source voltage is not greater than VDD when T1_BOOST is boosted above VDD.

Since T1D is delayed relative to T1, there is an initial time when transistor 534 is on and T1D is still low, causing transistor 534 to pull VY to ground. The low VY keeps transistor 524 on to connect VB to T1_BOOST to drive T1_BOOST to VDD. Transistors 520, 536 turn off with the high T1_BOOST. When T1_BOOST is high, transistors 530, 532 turn on, connecting node VX to the analog input A1 and driving the left plate of capacitor from ground to A1. The right plate of capacitor 535, node VB, is boosted from VDD to VDD+A1. Transistor 524 is off after the delay of inverters 502, 504, connecting VB to T1_BOOST, thus driving T1_BOOST above VDD to VDD+A1. When A1 is the drain voltage of the sampling switch transistor, both the gate-to-drain and gate-to-source voltages are at least VDD, reducing the ON resistance of the sampling switch.

VY is driven by A1 to make the gate-source voltage of transistor 524 to be VDD to continually turn off transistor 524 for the entire boost phase. Notice that transistor 534 is used for the initial moment of T1 going high to make sure the gate-source voltage of transistor 524 is VDD to turn it on. Then transistor 534 can be turned off without causing a problem.

ALTERNATE EMBODIMENTS

Several other embodiments are contemplated by the inventor. For example many possible variations of the bootstrap drive of FIG. 16 may be substituted. Clocks may be derived from other clocks and synchronized. Clocks may be buffered, enabled, and qualified by logic. The analog input signal may be buffered in a variety of ways and buffer arrangements or trees. Active-low rather than active-high SAR and other bits could be used.

Sampling capacitor 226 may be a parasitic capacitance rather than an actual capacitor device. Many variations of bootstrap driver 220 are possible and the circuit of FIG. 16 is provided as one of many possible implementations of bootstrap driver 220.

Providing a wider pulse width for the sampling clock relaxes the settling requirement. For a given size of sampling capacitor 226 (FIG. 7) with its KT/C noise requirement, transistor 224, analog buffer 30, and transistors in bootstrap driver 220 may be made smaller for a given frequency of operation. Alternately, a higher frequency of operation may be used. Sampling above 6 Ghz is possible. Since overlapping the sampling clocks doubles or even quadruples the sampling pulse width, the slower rise and fall times when using boosted gate voltages can be accommodated. The overlapping clocks reduce these bootstrap speed limitations.

High speed sampling also requires that a large size be used for analog buffer 30 so that sampled analog voltage SA1 can be quickly driven through transistor 224. However, kickback charges from transistor 224 turning on can couple from the output of analog buffer 30 to the input of analog buffer 30 and temporarily distort the linearity of analog buffer 30. Larger sizes of analog buffer 30 have high bandwidths and are more susceptible to kickback distortions. The relaxed timing provided by overlapping sampling clocks allows a smaller size to be used for analog buffer 30, reducing kickback distortion.

Binary-weighted capacitors 110, 108, 106, 104, . . . 102 could be connected to the power-supply or to some other voltage rather than to ground. These capacitors may be enabled by p-channel or n-channel transistors, and the bits stored in SAR delay 40 may be active-high or active-low, and these bits may be encoded in various ways and need to be decoded by a decoder in SAR delay 40. While binary-weighted capacitors 110, 108, 106, 104, . . . 102 have been shown, these capacitors could have other weight sequences, such as 1C, 1C, 2C, 5C, 11C, 15C, etc., and the Successive-Approximation-Register (SAR) programming could be adjusted for these non-binary sequence of weights. Rather than having binary-weighted capacitors 110, 108, 106,

104, ... 102, SAR delay 40 could employ other weighted delay elements, such as resistors, transistors or buffers of various sizes or weights. While binary-weighted capacitors have been described, other weightings could be substituted, such as decimally-weighted, prime-weighted, or linearly-weighted, or octal-weighted. The digital delay value in the SAR could be in these other number systems, such as octal numbers rather than binary numbers. Other kinds of delay elements could be substituted, such as parallel current sources, resistors, or various combinations, and in parallel, serial, or combined network arrangements. Values may be shifted, transformed, or processed in a variety of ways.

While product derivative correlator 52 has a particular midpoint correlation, other correlation functions could be substituted and product derivative correlator 52 adjusted to perform these substitute correlation functions. Inversions and complements may be added at various locations.

Switches 20, 22, 23, 24 may be simple transistor switches, pass transistors, transmission gates, or other kinds of switches. A latch or other storage element may be used as a delay with combinational logic including NAND, NOR, XOR, XNOR gates. Rather than use capacitors for delay elements, MOSFETs, FinFETs, or other devices, either p-channel or n-channel, driven to power or ground, may be used as delay elements.

While the first channel's SAR delay 40 may be initialized to the midpoint value of 1000 ... 0, a different channel could be initialized, or the initial value could be another value, such as 0100 ... 0, 0010 ... 0, etc. Any channel could act as the fixed timing reference, and the timing delay of that fixed reference could be any value.

Matrix processor 50 may use a Digital Signal Processor (DSP) or other processor that is efficient when performing matrix operations. Product derivative correlators 52 may be implemented in hardware and in parallel for high-speed calibration. Various combinations of hardware, firmware, and software may be used in these implementations and for calibrator 55.

A FIR filter may be added to the output of each ADC channel to act as a lowpass or bandpass filter for calibration, as long as the polarity of its correlation derivatives is known. FIR filtering can help define the polarity of its correlation derivatives to a well-defined value or specification to calibrate the interleaved ADC for a known frequency range. Since correlation derivatives are frequency dependent, FIR filtering can prevent any potential convergence problems during calibration.

While some operations have been described in a parallel manner for faster processing, serial operation may be used. When performed serially, a single instance of product derivative correlator 52 could be used rather than separate instances of product derivative correlator 52 in the hardware. While a bank of N product derivative correlators 52 have been shown, product derivative correlators 52 could be re-used or operate in various series and parallel arrangements.

Any process steps could be performed serially, or some steps may be performed in parallel. Various sequences may be adjusted or modified. Higher-level operations may be performed in software or firmware, such as SAR testing and decision logic, while lower-level functions may be performed in hardware, such as using product derivative correlator 52 to generate product derivative factors F1, F2, F3, F4. Some or all of the calibration routine could be replaced with hardware such as programmable logic, FPGA, or other logic gates on an Integrated Circuit (IC) or another chip. Various combinations of hardware, software, firmware, etc. may be substituted.

Product derivative correlators could operate upon more than 3 inputs as another alternative. Analog input buffers could be rearranged, so that one analog input buffer drives 4 or 2 ADCs, or there may be a tree structure of analog input buffers with multiple levels.

The number of samples averaged M could be different for foreground and background calibration and could even differ for different capacitor bit-positions, such as more samples for LSB's that are more sensitive and fewer samples for MSBs. M could also differ for other reasons such as varying voltage or temperature conditions.

The analog input signal AIN does not have to be a sine wave, but could be other forms of AC signals, such as a triangular wave, sine waves of different frequencies that are superimposed, or any wireless baseband signal. When the polarity of the correlation derivative can be determined, these signals may be used as input signals for calibration.

Averaging of the product derivative factors F1, F2, F3, F4 could be performed by setting a flip-flop when the sign bit is 1 and clearing the flip-flop when the sign bit is 0 for the current sum. A flip limit FL may be used for ending background calibration when incrementing the LSB keeps flipping sign bits more than the FL times. Alternately, background calibration can end when the sign bits first flip.

The number of channels N can be binary, non-binary, even or odd. While 4 channel interleaving has been shown in detail, 8-channel, 7-channel, 6-channel, 16-channel, 32-channel, or N-channel interleaved ADC's may be substituted. The interleave order of the channels may be changed. Interleaving may be nested or may be one long loop at level 1.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Inversions may be added, or extra buffering. Capacitors may be connected together in parallel to create larger capacitors that have the same fringing or perimeter effects across several capacitor sizes. Switches could be n-channel transistors, p-channel transistors, or transmission gates with parallel n-channel and p-channel transistors, or more complex circuits, either passive or active, amplifying or non-amplifying.

The number of ADC digital bits may be adjusted. For example, a 15-bit ADC could be used, or an 8-bit, 6-bit, 22-bit, or 18-bit. A different number of bits could be substituted for a different precision, and the number of bits could be fixed or could be variable.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A calibrated interleaved Analog-to-Digital Converter (ADC) comprising:
   a plurality of N channels, wherein N is a whole number of at least 4;
   a multi-phase clock generator for generating a plurality of channel sampling clocks;
   wherein each of the plurality of N channels receives a channel sampling clock in the plurality of channel sampling clocks;
   wherein the channel sampling clock for a channel in the plurality of N channels has a different phase offset than other channel sampling clocks for other channels in the plurality of N channels, each channel sampling clock having a pulse that overlaps pulses of channel sampling clocks for adjacent channels in the plurality of N channels;
   wherein each of the plurality of N channels comprises:
      an ADC for converting a sampled analog input into a digital output for a channel, the digital output having a digital value representing the sampled analog input for the channel;
      an analog switch that samples an analog input in response to a delayed clock;
      a Successive-Approximation-Register (SAR) that is programmed with a delay value during calibration; and
      a variable delay element having a variable delay that is controlled by the delay value stored in the SAR, the variable delay element delaying the channel sampling clock received for the channel by the variable delay to generate the delayed clock to the analog switch.

2. The calibrated interleaved ADC of claim 1 further comprising:
   a channel correlator for each of the plurality of N channels, the channel correlator for correlating the digital output of the channel to the digital output of adjacent channels in the plurality of N channels to generate a product derivative factor for the channel; and
   a correlation processor for receiving the product derivative factor for each of the plurality of N channels and for generating a sign vector having a correlation sign for N–1 of the plurality of N channels;
   wherein the SAR is programmed with delay values to compensate for timing skews among the plurality of N channels using a Successive-Approximation calibration routine that examines the correlation sign in the sign vector to determine when to accept or reject trial bits in the SAR of a channel corresponding to the correlation sign in the sign vector.

3. The calibrated interleaved ADC of claim 2 wherein the channel correlator for a current channel comprises an auto-correlator.

4. The calibrated interleaved ADC of claim 2 wherein the correlation processor comprises a matrix processor.

5. The calibrated interleaved ADC of claim 2 wherein each channel sampling clock has an active pulse that overlaps active pulses of channel sampling clocks for at least 2 adjacent channels in the plurality of N channels;
   whereby an active pulse width of the channel sampling clock is at least two sampling periods, wherein a sampling period is a period of the channel sampling clock divided by N.

6. The calibrated interleaved ADC of claim 5 wherein each of the plurality of N channels further comprises:
   a bootstrap driver that boosts a gate voltage of the delayed clock to a boosted voltage that is above a highest voltage of the channel delay element;
   whereby the analog switch is driven with the boosted voltage generated by the bootstrap driver.

7. The calibrated interleaved ADC of claim 6 wherein the highest voltage of the channel delay element is a power-supply voltage;
   wherein the bootstrap driver drives the boosted voltage to a voltage above the power-supply voltage;
   wherein the analog switch has a lower on resistance when the analog switch is driven with the boosted voltage than when the analog switch is driven with the power-supply voltage.

8. The calibrated interleaved ADC of claim 7 wherein the analog switch further comprises a transistor having a gate that receives the boosted voltage to control current between the analog input and the sampled analog input.

9. The calibrated interleaved ADC of claim 7 further comprising:
   a tree of analog buffers that comprises:
   an initial analog buffer that receives an initial analog input to the calibrated interleaved ADC and generates a first-level output:
   at least two second-level analog buffers that receives the first-level output and generate a plurality of second-level outputs;
   wherein a final-level of analog buffers drives the analog input to the analog switch in each of the plurality of N channels;
   wherein the final-level of analog buffers is the at least two second-level analog buffers or a third-level or higher level of analog buffers.

10. The calibrated interleaved ADC of claim 7 wherein each of the plurality of N channels further comprises:
    a background offset corrector that averages the digital output for the channel from the ADC to generate a moving average that is subtracted from the digital output to generate an offset-corrected digital output;

a gain corrector that generates a moving root-mean-square of the offset-corrected digital output for the channel.

11. The calibrated interleaved ADC of claim 10 wherein the gain corrector further divides the offset-corrected digital output by the moving root-mean-square to generate a normalized digital output for the channel.

12. The calibrated interleaved ADC of claim 7 wherein N is a whole number of at least 8.

13. The calibrated interleaved ADC of claim 7 further comprising:
a Successive-Approximation calibrator, for each correlation sign in the sign vector
(a) adding a test bit-position to the SAR of a channel having a corresponding correlation sign in the sign vector having a value of 1;
(b) subtracting the test bit-position to the SAR of the channel having the corresponding correlation sign in the sign vector having a value of 0;
and repeating from (a) for successively smaller bit-positions in the SAR,
whereby the correlation sign in the sign vector is used to add or subtract successive bit-positions in the SAR.

14. The calibrated interleaved ADC of claim 13 wherein the digital output from the ADC is at least 6 bits.

15. The calibrated interleaved ADC of claim 14 wherein the variable delay element comprises a plurality of binary-weighted capacitors that are each enabled by a bit in the SAR.

16. The calibrated interleaved ADC of claim 2 wherein each channel sampling clock has an active pulse that overlaps active pulses of channel sampling clocks for at least 4 adjacent channels in the plurality of N channels;
whereby an active pulse width of the channel sampling clock is at least four sampling periods, wherein a sampling period is a period of the channel sampling clock divided by N.

17. An overlapping-clock interleaved Analog-to-Digital Converter (ADC) comprising:
a plurality of N channels, wherein N is a whole number of at least 3;
an overlapping multi-phase clock input for receiving a plurality of channel sampling clocks having active pulses that overlap active pulses of channel sampling clocks for other channels in the plurality of N channels;
wherein each of the plurality of N channels receives a channel sampling clock in the plurality of channel sampling clocks;
wherein the channel sampling clock for a channel in the plurality of N channels has a different phase offset than other channel sampling clocks for other channels in the plurality of N channels, each channel sampling clock having an active pulse that overlaps active pulses of channel sampling clocks for adjacent channels in the plurality of N channels;
wherein each channel comprises:
an ADC having a sampled analog input and a digital output;
a sampling switch between an analog input and the sampled analog input, the sampling switch responsive to a delayed clock;
a Successive-Approximation-Register (SAR) that stores a delay setting; and
a delay element generating a variable delay between the delayed clock and a channel sampling clock received from the overlapping multi-phase clock input, wherein the variable delay is determined by the delay setting in the SAR.

18. The overlapping-clock interleaved ADC of claim 17 wherein each channel further comprises:
a bootstrapper for boosting an active voltage of the delayed clock that is generated by the delay element in response to the active pulse of the channel sampling clock, the bootstrapper applying a boosted voltage to the sampling switch.

19. The overlapping-clock interleaved ADC of claim 17 wherein each channel further comprises:
a filter for generating a filtered channel output from the digital output of the ADC;
a product derivative correlator, receiving the filtered channel output of a channel and the filtered channel outputs from adjacent channels, the product derivative correlator generating a product derivative factor indicating a correlation of the channel to the adjacent channels;
a processor that receives a plurality of the product derivative factor from the product derivative correlator for the plurality of N channels and generates a sign-bit vector; and
a calibrator, using each sign bit in the sign-bit vector to decide when to add a test bit to the SAR for a channel, and when to remove the test bit from the SAR for the channel, wherein each sign bit in the sign-bit vector is for adding or removing a test bit from a SAR in a different channel in the plurality of N channels;
whereby each sign bit is used to add or subtract successive bit-positions in the SAR.

20. An interleaved Analog-to-Digital Converter (ADC) with overlapping multi-phase clocks comprising:
an analog input;
a plurality of channels;
a buffer tree of analog buffers that receive the analog input and generate a plurality of analog input signals to the plurality of channels;
a clock generator that generates a plurality of channel clocks each having a different phase and a same frequency and a same active pulsewidth, wherein an active pulsewidth for a channel overlap with the active pulsewidth of a previous channel and overlaps with the active pulsewidth of a following channel in an interleave order of the plurality of channels;
wherein each channel further comprises:
a channel ADC having a sampled analog input and a digital output;
a sampling switch between an analog input signal in the plurality of analog input signals and the sampled analog input, the sampling switch responsive to a delayed clock;
a Successive-Approximation-Register (SAR) that stores a delay setting for the channel; and
a delay element adding a variable delay to a channel clock received from the clock generator to generate a delayed clock, wherein the variable delay is determined by the delay setting in the SAR;
a bootstrapper for boosting an active voltage of the delayed clock that is generated by the delay element in response to the active pulsewidth of the channel clock, the bootstrapper applying a boosted voltage to the sampling switch;
a channel correlator for correlating the digital output from the channel to digital outputs from adjacent channels in the plurality of channels to generate a correlation sign bit for the channel; and
a calibrator, using the correlation sign bit to decide when to add a test bit to the SAR for a channel, and when to remove the test bit from the SAR for the channel, wherein each correlation sign bit is for adding or removing a test bit from a SAR in a different channel in the plurality of channels.

\* \* \* \* \*